United States Patent
Sato et al.

(10) Patent No.: US 7,147,141 B2
(45) Date of Patent: Dec. 12, 2006

(54) PRECONDITIONING VIA PLUG MATERIAL FOR A VIA-IN-PAD BALL GRID ARRAY PACKAGE

(75) Inventors: Daryl Sato, Beaverton, OR (US); Gary Paek, Banks, OR (US); John Dungan, Hillsboro, OR (US); David W. Boggs, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 278 days.

(21) Appl. No.: 10/294,516

(22) Filed: Nov. 13, 2002

(65) Prior Publication Data

US 2004/0089700 A1    May 13, 2004

(51) Int. Cl.
B23K 31/02  (2006.01)
H05K 3/34  (2006.01)

(52) U.S. Cl. .................. 228/180.22; 29/840
(58) Field of Classification Search .......... 228/180.22, 228/180.21, 39–41; 174/250, 263
See application file for complete search history.

(56) References Cited

U.S. PATENT DOCUMENTS

| | | | |
|---|---|---|---|
| 5,243,142 A * | 9/1993 | Ishikawa et al. ............ 174/262 |
| 5,275,330 A * | 1/1994 | Isaacs et al. ............ 228/180.21 |
| 5,463,191 A * | 10/1995 | Bell et al. .................... 174/263 |
| 5,511,306 A * | 4/1996 | Denton et al. ................ 29/840 |
| 6,037,665 A * | 3/2000 | Miyazaki ..................... 257/773 |
| 6,252,779 B1 * | 6/2001 | Pierson et al. ............... 361/774 |
| 6,268,016 B1 * | 7/2001 | Bhatt et al. ................. 118/689 |
| 6,361,823 B1 * | 3/2002 | Bokisa et al. ............... 427/97.3 |
| 6,391,123 B1 * | 5/2002 | Nakamura et al. ............ 148/24 |
| 6,429,839 B1 * | 8/2002 | Sakamoto ..................... 345/87 |
| 6,528,352 B1 * | 3/2003 | Jackson et al. .............. 438/118 |
| 6,599,833 B1 * | 7/2003 | Farquhar et al. ............ 438/667 |
| 6,651,869 B1 * | 11/2003 | Aspandiar et al. ..... 228/180.21 |
| 6,724,638 B1 * | 4/2004 | Inagaki et al. .............. 361/763 |
| 2003/0047348 A1 * | 3/2003 | Jessep et al. ................ 174/250 |
| 2003/0057974 A1 * | 3/2003 | McCormick et al. ....... 324/754 |
| 2005/0258522 A1 * | 11/2005 | En et al. ..................... 257/670 |

* cited by examiner

Primary Examiner—Lynne R. Edmondson
(74) Attorney, Agent, or Firm—Blakely, Sokoloff, Taylor & Zafman LLP

(57) ABSTRACT

A method for providing an improved solder joint for a via-in-pad ball grid array package. One or more bonding pads are formed upon a substrate. One or more vias are formed through the substrate within the bonding pad. The vias are plugged with a via plug material. The via plug material is then preconditioned such that an amount of volatiles within the via plug material is reduced.

17 Claims, 5 Drawing Sheets

PRECONDITIONING VIA PLUG MATERIAL FOR A VIA-IN-PAD BALL GRID ARRAY PACKAGE

FIELD

Embodiments of the invention relates generally to the field of surface mount technology for integrated circuit (IC) packages, and more specifically to an improved via-in-pad (VIP) ball grid array (BGA).

BACKGROUND

Integrated circuits (ICs) are typically assembled into packages that are physically and electrically coupled to a substrate such as a printed circuit board (substrate) to form an "electronic assembly". The "electronic assembly" can be part of an "electronic system". An "electronic system" is broadly defined herein as any product comprising an "electronic assembly". Examples of electronic systems include computers (e.g., desktop, laptop, hand-held, server, etc.), wireless communications devices (e.g., cellular phones, cordless phones, pagers, etc.), computer-related peripherals (e.g., printers, scanners, monitors, etc.), entertainment devices (e.g., televisions, radios, stereos, tape and compact disc players, video cassette recorders, etc.), and the like.

In the field of IC package mounting there is a constant pressure to increase component density and performance while decreasing production costs. Each new generation of board-level packaging must provide increased performance while generally being smaller or more compact in size.

A substrate typically includes a number of insulation and metal layers selectively patterned to provide metal interconnect lines (referred to herein as "traces"), and a plurality of electronic components mounted on one or more surfaces of the substrate and functionally interconnected through the traces. The routing traces typically carry signals that are transmitted between the electronic components, such as ICs, of the system. Some ICs have a relatively large number of input/output (I/O) pads. The large number of I/O pads requires a relatively large number of routing traces. Some substrates require multiple layers of routing traces to accommodate all of the system interconnections. Routing traces located within different layers are typically connected electrically by vias formed in the board. A via can be made by making a hole through some or all layers of a substrate and then coating or plating the interior hole surface with an electrically conductive material, such as copper.

BGA is a surface mount technology that typically uses a plurality of conductive interconnects, which may be ball shaped and formed from solder or conductive polymers, on one surface of the component, as electrical and physical connections to the substrate. Each conductive ball connects to a conductor within the component and is coupled to corresponding metallized mounting or bonding pads (pads) on the surface of the substrate.

FIGS. 1A, 1B, and 1C illustrate conventional layouts for vias and pads in accordance with the prior art. A typical configuration on the substrate is the interstitial via or "dogbone" layout shown in FIG. 1A. System 100A illustrates the key feature of the dogbone layout, which is the separation of the vias, represented by via 110A from the pads represented by pad 114A. The vias are electrically coupled to the pads through traces represented by trace 112A. This physical separation, of the via from the pad, helps to prevent the conductive ball from wicking down the via during the soldering process. However, the dogbone layout provides limited open channel space (space between vias) for circuit connections. This limits the density of the connections.

FIG. 1B illustrates a variation known as a via-behind-pad (VPB) layout. System 100B, includes vias (e.g., 110B) coupled to pads (e.g., 114B) by traces (e.g., 112B). The distance between the vias and the pads (and hence the length of the traces) is less than the dogbone layout. This is achieved through improved solder mask registration technology. To further increase connection densities, a via-in-pad (VIP) layout is employed. FIG. 1C illustrates the VIP layout. In system 300, the vias (e.g., 110C) are implemented within the pads (e.g., 114C), thus conserving valuable "real estate" on the substrate that would otherwise be separately occupied by the via and the pad.

Though the higher connection density achieved with a VIP layout results in decreased package size and cost, it is not without drawbacks. The typical production process for a VIP-BGA substrate involves partially filling the via with solder mask material to prevent solder from draining down into the via and out the other side of the substrate. During assembly when the conductive balls of the IC/Package are reflowed (heated) to form the connections, volatile organic compounds (volatiles) within the solder mask may expand or "outgas" upwards into the overlying conductive balls. This may cause the conductive balls to expand creating short circuits with other conductive balls, or may cause voids where the conductive balls are supposed to make contact with the vias, creating open circuits, or may otherwise degrade or destroy the conductive ball, which adversely impacts reliability. This problem has been identified and addressed in the prior art, though not entirely satisfactorily, by significantly reducing the diameter of the via. Thus, less solder mask to plug the via and therefore less volatiles. This method results in reduced expansion of the conductive balls and reduced voids within the conductive balls, but has additional manufacturing and tooling costs.

BRIEF DESCRIPTION OF THE DRAWINGS

Embodiments of the invention may be best understood by referring to the following description and accompanying drawings that are used to illustrate embodiments of the invention. In the drawings.

DETAILED DESCRIPTION

An embodiment of the invention provides a method for producing a VIP-BGA having preconditioned via plug material (VPM). During the preconditioning process, a substantial portion of the plug material volatiles is driven off. For one embodiment, the preconditioning is accomplished during a standard high-temperature manufacturing process. For such an embodiment, in which the via plug material is a solder mask material, the preconditioning is accomplished during the hot air solder leveling (HASL) process presently used in VIP-BGA manufacturing. Such an embodiment eliminates the need for a via-capping process.

In the following description, numerous specific details are set forth. However, it is understood that embodiments of the invention may be practiced without these specific details. In other instances, well-known circuits, structures and techniques have not been shown in detail in order not to obscure the understanding of this description.

Reference throughout the specification to "one embodiment" or "an embodiment" means that a particular feature, structure, or characteristic described in connection with the embodiment is included in at least one embodiment of the present invention. Thus, the appearance of the phrases "in one embodiment" or "in an embodiment" in various places throughout the specification are not necessarily all referring to the same embodiment. Furthermore, the particular features, structures, or characteristics may be combined in any suitable manner in one or more embodiments.

Figure 1A:
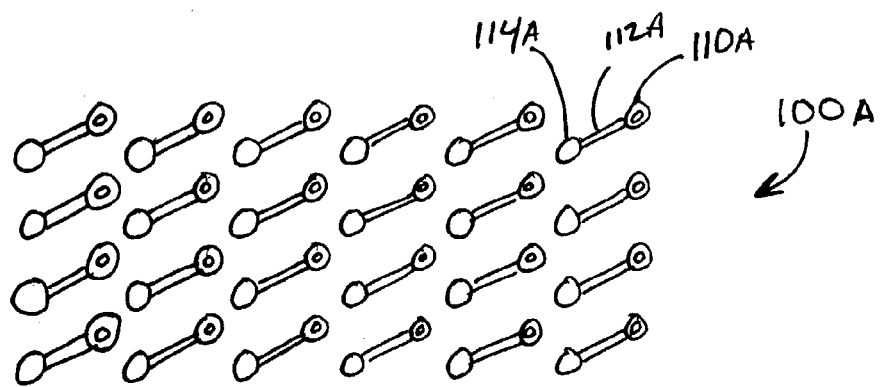
FIGS. 1A, 1B, and 1C illustrate conventional layouts for vias and pads in accordance with the prior art.
Figure 1B:
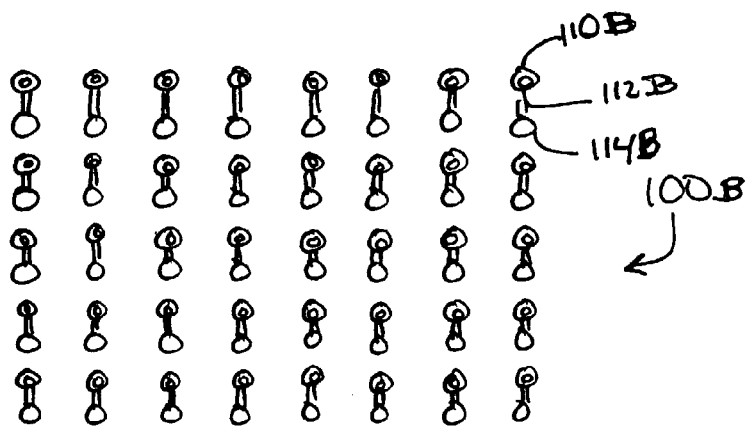
Figure 1C:
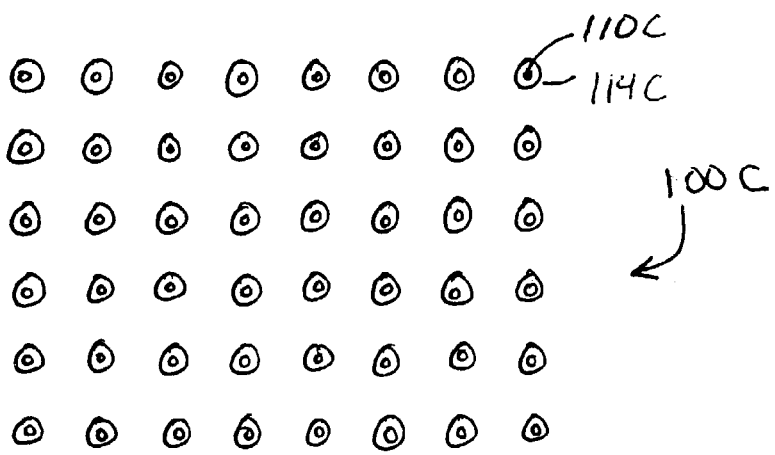
Figure 2:
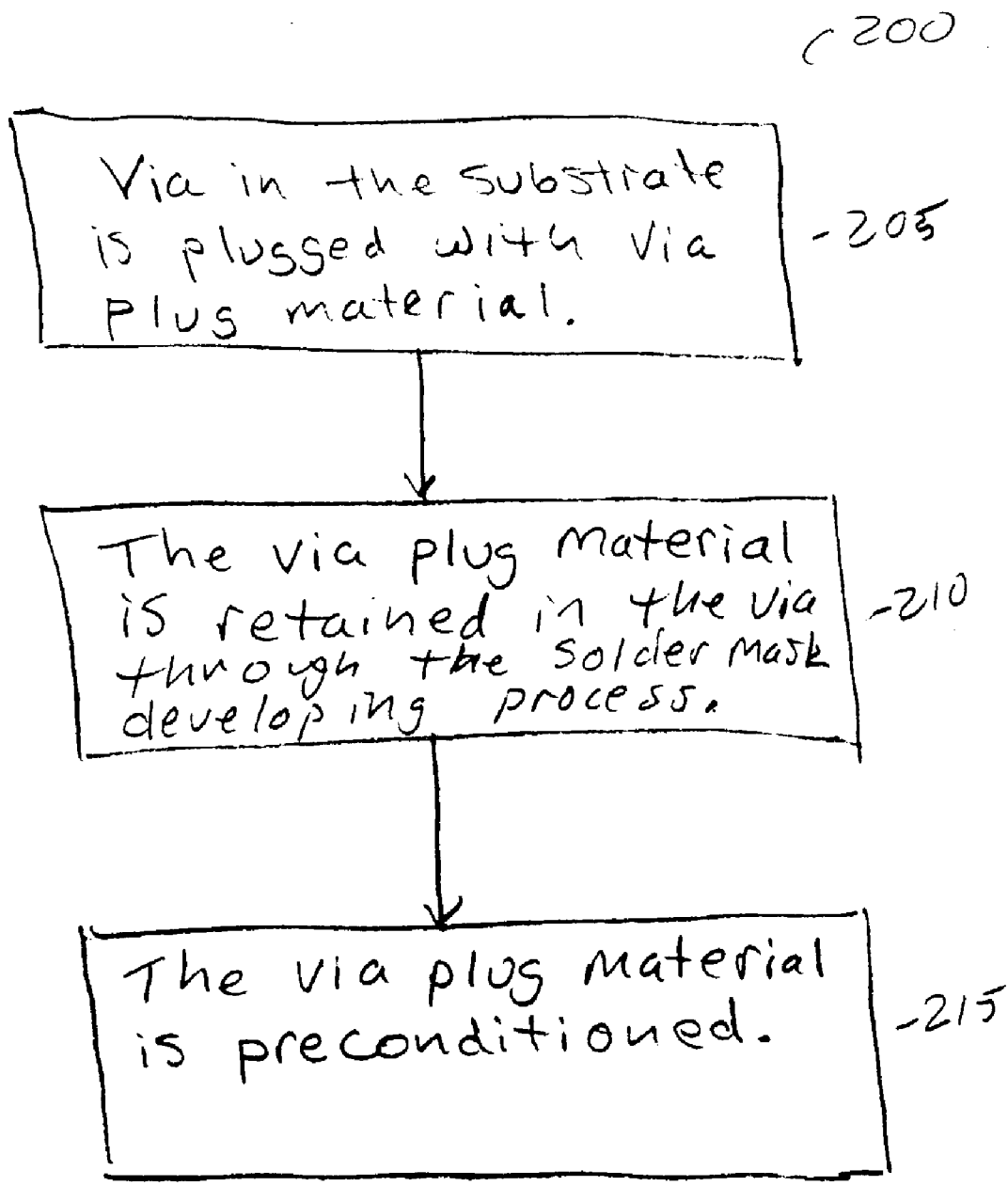
FIG. 2 is a portion of the process flow diagram of a process in which a VIP-BGA is produced in accordance with one embodiment of the invention.
Figure 3A:
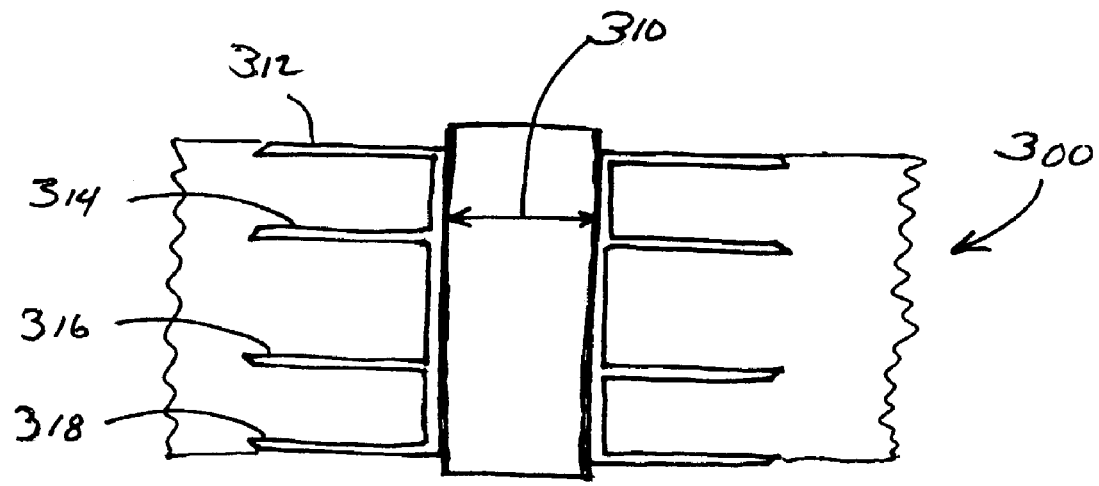
FIGS. 3A and 3B illustrate, respectively, a substrate via prior to plugging, and subsequent to plugging, in accordance with one embodiment of the invention.
Figure 3B:
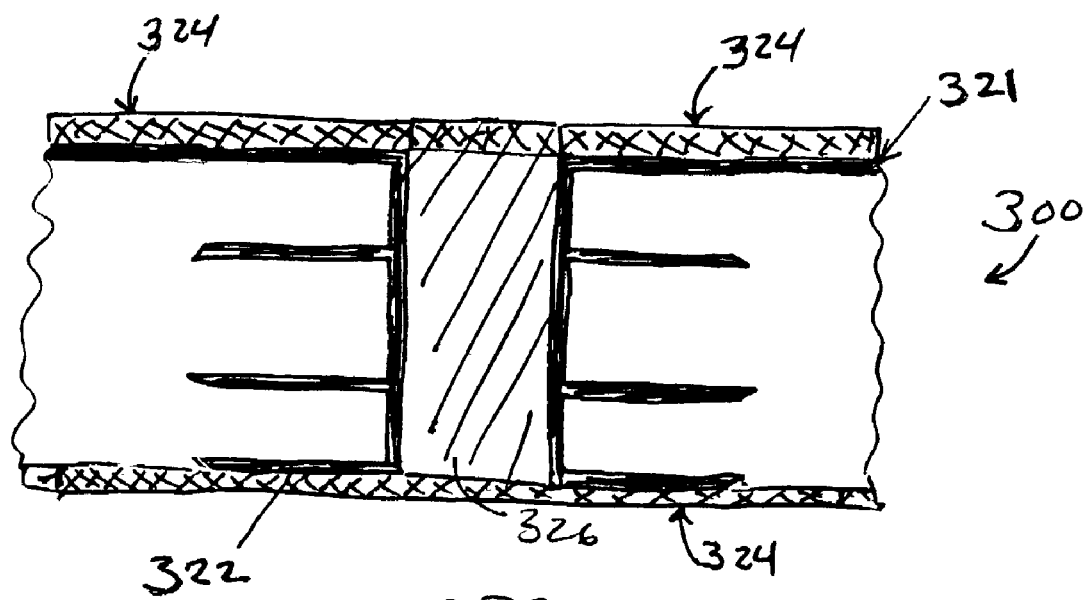

FIG. 2 is a portion of a process flow diagram of a process in which a VIP-BGA is produced in accordance with one embodiment of the invention. Process 200 begins with operation 205 in which a via of a substrate (e.g., PCB) is plugged with VPM. For one embodiment this is accomplished subsequent to a typical strip-etch-strip process. FIGS. 3A and 3B illustrate a substrate via prior to plugging, and subsequent to plugging, respectively. As shown in FIG. 3A, substrate 300 is a multilayer structure having a via 310 therethrough. In alternative embodiments, the substrate 300 may be a single layer structure. Via 310 is typically comprised of a conductive metal (e.g., copper) tube to enable interconnection between the conductive layers 312, 314, 316, and 318. The conductive layers are typically comprised of a sheet material (e.g., glass fabric) impregnated with a curable resin. At this point in the manufacturing process, the via 310 has nothing in it. FIG. 3B illustrates the substrate of FIG. 3A wherein the via 310 is plugged with VPM. For one embodiment the VPM is a liquid photo-imageable solder mask (SM) material. As shown in FIG. 3B, for such an embodiment, the via may be completely filled with the SM material 326 which may also provide a SM coating 324 for the primary surface 321 and the secondary surface 322 of the substrate 300. In various alternative embodiments, the VPM may be a material other than SM and the via may not be completely filled with VPM.

Figure 4:
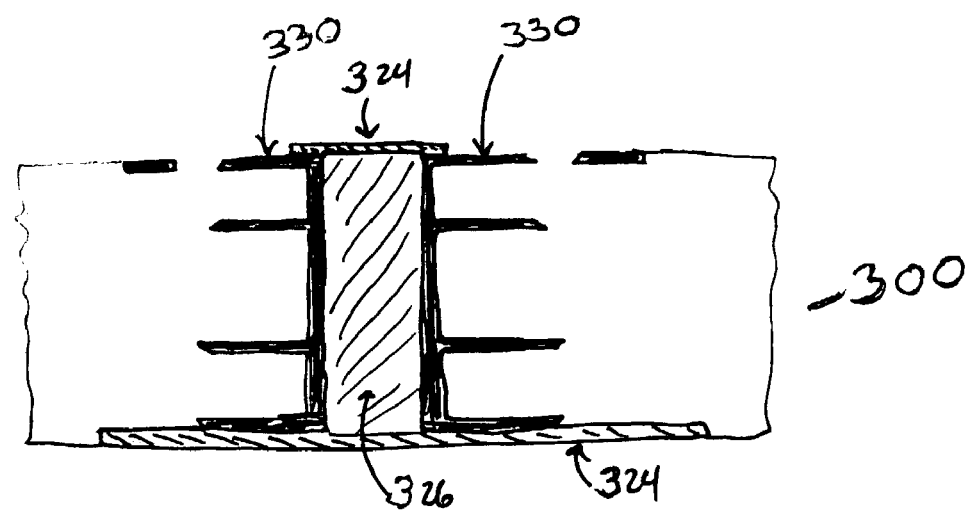
FIG. 4 illustrates the substrate 300 of FIG. 3B having a developed SM layout in accordance with one embodiment of the invention.

Referring again to FIG. 2, at operation 210 the VPM is retained within the via through the SM developing process. This is in contrast to the typical prior art process in which the solder masking is accomplished without plugging the via. In the SM developing process, the desired SM layout (that portion of SM to be retained on the substrate) is polymerized through exposure to ultraviolet (UV) light. The substrate is selectively exposed to UV light using a photo tool that blocks UV light in some desired areas, but allows the UV light to pass in others. After exposure to the UV light, the substrate is put through a chemical wash that removes the solder mask in those areas that were not exposed to the UV light. This results in the desired layout of the solder mask. FIG. 4 illustrates the substrate 300 of FIG. 3B having a developed SM layout. As shown in FIG. 4, the exposed portion of SM 324, including the SM covering the via is retained and the VPM 326 is retained within the via. However, the unexposed SM covering the pad 330 has now been removed. Had the solder mask covering the via not been retained, the VPM would have been removed during the chemical wash process. For one embodiment a photo tool that is approximately 0–3 mils larger than the circumference of the vias is used. This leaves solder mask unexposed over the pad area, but exposed over the via as desired.

Figure 4A:
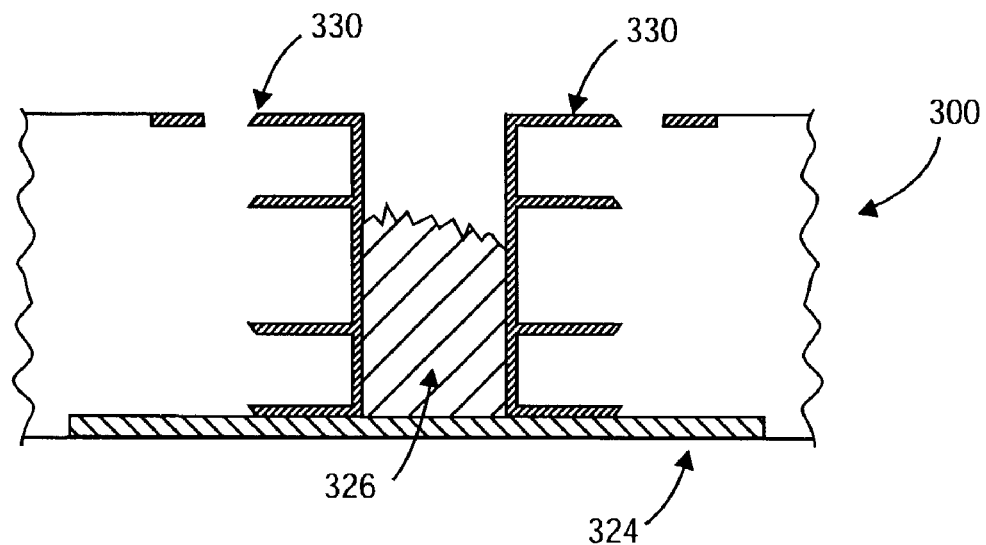
FIG. 4A illustrates the substrate 300 of FIG. 3B having a developed SM layout in accordance with an alternative embodiment of the invention.

FIG. 4A illustrates an embodiment of the invention in which the via is not completely filled with VPM.

Referring again to FIG. 2, at operation 215 the VPM is preconditioned to remove volatiles or other problematic components such as gases or moisture. This is accomplished, for one embodiment, by subjecting the VPM to a high-temperature process, the temperature of which is sufficient to drive the volatiles and gases from the VPM. For an embodiment in which the VPM is SM material, the temperature may be approximately 183 C, which is the temperature of the solder reflow process. For such an embodiment, the high-temperature process used for preconditioning the VPM may be a standard hot-air-solder-leveling (HASL) manufacturing process. After the SM developing process, the areas of the substrate not covered by SM are coated with solder. It is desirable that the solder be evenly applied and the amount of solder applied be controlled. This may be accomplished through a HASL process. Typically the solder may be introduced by submerging the substrate in a pot of molten solder or a solder wave. Then hot air is applied at high velocity in the HASL process. The hot air keeps the solder molten (or melts the solder) and the velocity of the air forces excess solder from the board. It is during this high temperature process that the VPM is preconditioned for one embodiment of the invention. The high temperature air of the HASL process causes the solder mask within the via to outgas (de-aerate or other gaseous emission). This results in the substantial reduction or absence of volatiles or other unevaporated thermally expansive material within the via. Because the VPM has been retained in the via, there is no need for a separate via capping process required in the typical prior art VIP-BGA production methods.

Figure 5:
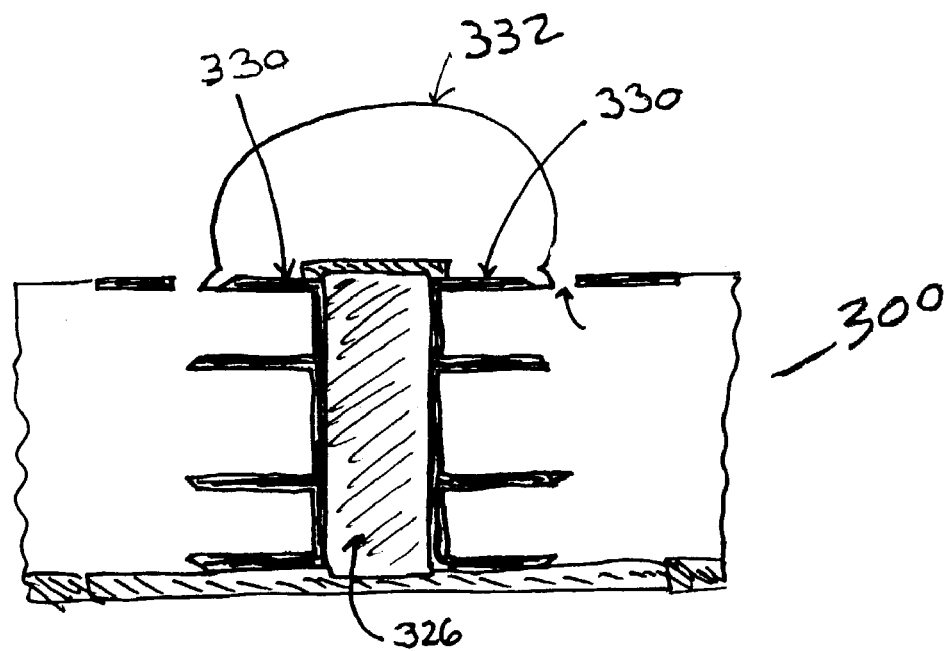
FIG. 5 illustrates the substrate 300 of FIG. 4 after undergoing a process to precondition the VPM in accordance with one embodiment of the invention.

After the VPM has been preconditioned, the process of creating a VIP-BGA package continues in a conventional manner. A solder paste is screened over the substrate to coat the pads. Components (e.g., ICs) having conductive balls are then placed on the pads. FIG. 5 illustrates the substrate 300 of FIG. 4 after undergoing a process to precondition the VPM. In FIG. 5, the conductive ball 332, attached to the component (not shown) is placed upon the pad 330. The conductive ball 332 is placed over the via that contains VPM 326. The components are subsequently electrically connected to the substrate by reflowing the solder. The VPM, having had a substantial portion or all of the volatiles driven therefrom, exhibits substantially reduced outgassing during solder reflow.

Figure 5A:
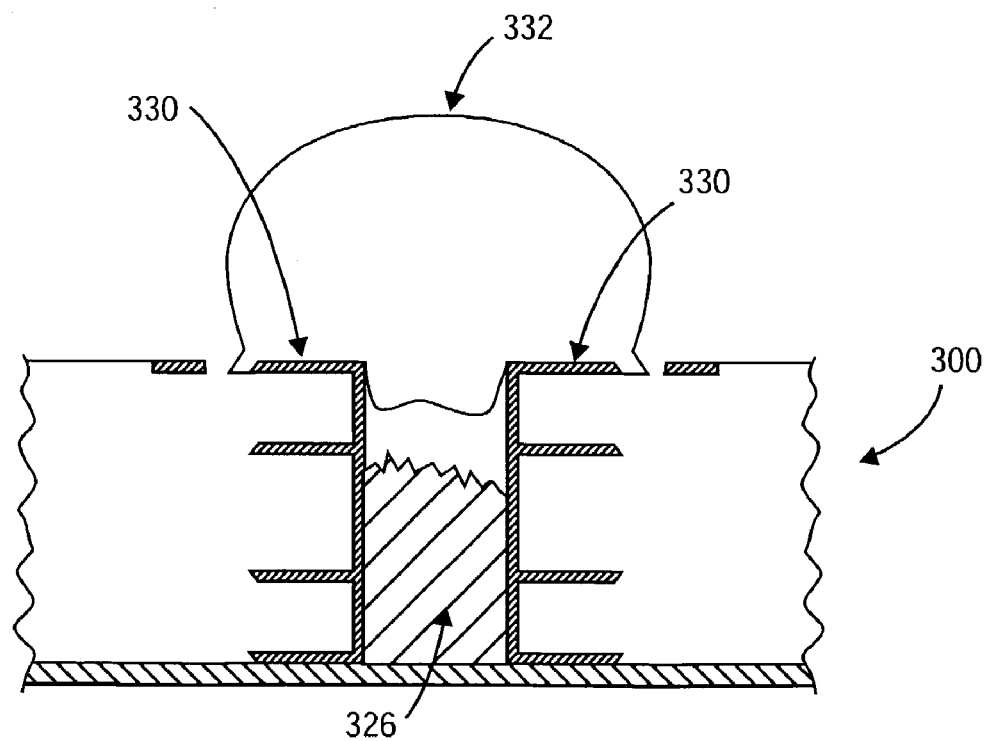
FIG. 5A illustrates the substrate 300 of FIG. 4A after undergoing a process to precondition the VPM in accordance with one embodiment of the invention.

FIG. 5A illustrates an embodiment of the invention in which the via is not completely filled with VPM. As shown in FIG. 5A, the conductive ball 332 partially fills the via 310. In an alternative embodiment, the conductive ball 332 may fill the entire portion of the via 310 left unfilled by the VPM 326.

General Matters

Embodiments of the invention have been described in which preconditioning of the VPM is accomplished by plugging the via with SM material during a typical SM process, retaining the SM within the via throughout SM developing, and subjecting the SM filling of the via to a typical HASL process. This is in contrast to the prior art in which the via is plugged with SM after the HASL process has been accomplished as discussed above in reference to FIG. 2. Such an embodiment of the invention offers advantages over the prior art in that the HASL process drives volatiles and other problematic components from the VPM prior to the solder reflow process. An additional benefit of such an embodiment is the elimination of the via capping step necessary in the prior art manufacturing process as discussed above in reference to FIG. 2.

For one embodiment of the invention the via is filled or substantially filled with VPM. This reduces corrosion which may occur due to etching solution entering the via during the surface finish process. A substantially filled via also reduces the area in which air may be trapped within the via. Such an air pocket could expand during reflow and degrade the conductive ball.

In various alternative embodiments the VPM need not be SM material, but may be a variety of other suitable materials. For example, the VPM may be a conductive material comprising an SM material embedded with metal (e.g., silver) shavings.

In various alternative embodiments, the high temperature process used to cause outgassing of the VPM need not be the standard HASL process, but may be an alternative or an additional process. In still another alternative embodiment the preconditioning may not be accomplished using a high temperature process, but may be alternatively be accomplished by subjecting the VPM to low pressure to cause outgassing. For still another alternative embodiment, a combination of high temperature and low pressure may be used to effect outgassing.

While the invention has been described in terms of several embodiments, those skilled in the art will recognize that the invention is not limited to the embodiments described, but can be practiced with modification and alteration within the spirit and scope of the appended claims, The description is thus to be regarded as illustrative instead of limiting.

What is claimed is:

1. A method comprising:
    forming one or more bonding pads upon a substrate;
    forming one or more vias through the substrate, the vias formed within the bonding pad;
    plugging the one or more vias with a via plug material, the via plug material containing an amount of volatiles and the via plug material being a non-conductive material;
    covering the one or more vias with a solder mask through a solder mask process, wherein the solder mask is in direct contact with the via plug material, and wherein the solder mask is polymerizable through ultraviolet light;
    preconditioning the via plug material to reduce a portion of the amount of volatiles within the via plug material; and
    performing a reflow process on the substrate after preconditioning the via plug material while retaining the preconditioned via plug material within the one or more vias.

2. The method of claim 1 wherein the via plug material is a solder mask material.

3. The method of claim 1 wherein the via plug material is preconditioned through a high-temperature process.

4. The method of claim 3 wherein the high-temperature process is a hot air solder leveling process.

5. The method of claim 1 further comprising:
    positioning a conductive ball array on the substrate, the conductive ball array having a plurality of conductive balls, each conductive ball corresponding to one of the one or more bonding pads;
    subjecting the substrate to a high temperature reflow process such that each conductive ball is melted to a corresponding bonding pad forming a conductive joint.

6. The method of claim 5 wherein each of the one or more vias is substantially filled with via plug material such that degradation of the conductive joint due to expanding air within the via during the high temperature reflow process is reduced.

7. The method of claim 1 wherein the via plug material is preconditioned through a low pressure process.

8. The method of claim 1 wherein the via plug material is preconditioned through a combination of one or more high temperature and one or more low pressure processes.

9. A method comprising:
    forming one or more bonding pads upon a substrate;
    forming one or more vias through the substrate, the vias formed within the bonding pad;
    plugging the one or more vias with a via plug material, the via plug material containing an amount of volatiles;
    covering the one or more vias with a solder mask through a solder mask process, wherein the solder mask is in direct contact with the via plug material, and wherein the solder mask is polymerizable through ultraviolet light; and
    preconditioning the via plug material to reduce a portion of the amount of volatiles within the via plug material, wherein the via plug material comprised solder mask material embedded with metal shavings.

10. A method comprising:
    forming one or more conductive vias through a printed circuit board, each of the one or more conductive vias formed through a corresponding bonding pad formed upon a substrate;
    coating the printed circuit board with a solder mask material such that one or more via plugs is formed from a portion of the solder mask material, each via plug plugging one of the one or more conductive vias with the portion of solder mask material;
    developing the solder mask coating of the printed circuit board such that the solder mask material is retained within the one or more conductive vias, the solder mask material being in direct contact with the via plugs, the solder mask material being polymerizable through ultraviolet light, and such that the solder mask material is removed from a portion of each of the corresponding bonding pads; and
    subjecting the printed circuit board to a preconditioning process such that volatiles within the one or more via plugs is driven off, wherein the solder mask material is embedded with metal shavings.

11. The method of claim 10 wherein the solder mask material is a photo-imageable solder mask material.

12. The method of claim 11 wherein the preconditioning process is a high-temperature process.

13. The method of claim 12 wherein the high-temperature process is a hot air solder leveling process.

14. The method of claim 13 further comprising:
positioning a conductive ball array on the printed circuit board, the conductive ball array having a plurality of conductive balls, each conductive ball corresponding to one of the corresponding bonding pads;
subjecting the substrate to a high temperature reflow process such that each conductive ball is melted to a corresponding bonding pad forming one or more conductive joints.

15. The method of claim 14 wherein each of the one or more conductive vias is substantially filled with solder mask material such that degradation of the one or more conductive joints, due to expanding air within the via during the high temperature reflow process, is reduced.

16. The method of claim 10 wherein the preconditioning process is a low pressure process.

17. The method of claim 10 wherein the preconditioning process is a combination of one or more high temperature and one or more low pressure processes.

* * * * *